(12) United States Patent
Huang et al.

(10) Patent No.: US 6,597,964 B1
(45) Date of Patent: Jul. 22, 2003

(54) THERMOCOUPLED LIFT PIN SYSTEM FOR ETCHING CHAMBER

(75) Inventors: Yu-Chih Huang, Taichung (TW); Yin-Cheng Ma, Taipei (TW); Sawyer Ho, Taipei (TW); Wen-Shyang Tsai, Junghe (TW); Chen-Feng Lin, Miaoli (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/141,594

(22) Filed: May 8, 2002

(51) Int. Cl.[7] ............................................. G06F 19/00
(52) U.S. Cl. ...................... 700/121; 118/729; 414/935
(58) Field of Search ........................ 700/121; 118/729, 118/724; 414/935; 204/298.25; 432/81

(56) References Cited

U.S. PATENT DOCUMENTS 5,772,773 A * 6/1998 Wytman ..................... 118/729
5,854,468 A * 12/1998 Muka ..................... 204/298.25
6,394,797 B1 * 5/2002 Sugaya et al. ................ 432/81
6,523,494 B1 * 2/2003 Perng et al. ............. 118/723 E

* cited by examiner

Primary Examiner—Albert W. Paladini
(74) Attorney, Agent, or Firm—Tung & Associates

(57) ABSTRACT

A thermocoupled lift system for semiconductor etch chambers. The system comprises multiple thermocoupled lift pins which are vertically extendible from a heater block inside a semiconductor etch chamber and are capable of lowering a semiconductor wafer onto the heater block before the etching process and lifting the wafer from the heater block after the etching process. In the event that the temperature of the wafer exceeds a predetermined value after the etching process, the lift pins trigger release of a cooling purge gas such as nitrogen into the etching chamber to partially cool the wafer prior to transfer of the wafer to a cool down chamber for further cooling. The initial gas-induced cooling of the wafer prevents thermal stressing thereof upon transfer of the wafer to the cool down chamber.

20 Claims, 2 Drawing Sheets

THERMOCOUPLED LIFT PIN SYSTEM FOR ETCHING CHAMBER

FIELD OF THE INVENTION

The present invention relates to etching chambers used in the etching of material layers on a semiconductor wafer substrate to fabricate semiconductor integrated circuits on the substrate. More particularly, the present invention relates to a thermocoupled lift pin system for measuring the backside temperature of a semiconductor wafer substrate after an etching process in order to prevent thermal cracking of the substrate upon subsequent transfer of the substrate from a high-temperature etching chamber to a lower-temperature loadlock or cooldown chamber.

BACKGROUND OF THE INVENTION

In the semiconductor production industry, various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

FIG. 1 illustrates a typical conventional wafer processing station 10 such as a Mattson ASPEN-III plasma etcher used in etching material layers on semiconductor wafers 14. The processing station 10 typically includes a loading port 13 which receives a front open unified cassette pod (FOUP) 12 from an automatic guided vehicle (AGV), overhead transport (OHT) vehicle or other pod transfer vehicle (not illustrated) in the cleanroom. A robot or other wafer transfer device 20 unloads the wafers 14 from the FOUP 12 and transfers the wafers 14 through a wafer transfer chamber 18 to a load lock/cool down chamber 22. A wafer transfer robot 26 in a wafer transfer chamber 24 transfers the wafers 14 from the load lock/cool down chamber 22 to a process chamber 28.

The wafer transfer robot 26 positions each wafer 14 on a corresponding set of multiple wafer lift pins 32 which are upwardly extended from a heater block 30 contained inside the process chamber 28, as illustrated in FIG. 2. The lift pins 32 are vertically slidably disposed in respective lift pin openings (not illustrated) in the heater block 30 and contact the bottom surface or backside of the wafer 14 in order to lower the wafer 14 to rest on the heater block 30 prior to the etching process and also lift the wafer 14 from the heater block 30 after the etching process. Raising and lowering of the lift pins 32 is facilitated by operation of a lift pin drive assembly (not illustrated). In the process chamber 28, the heater block 30 heats the wafer 14 to temperatures typically in the range of about 200° C.–250° C. during the etching process as reactive plasma or reactive gases such as chlorine are used to etch the unmasked conductive layer or layers from each wafer.

After completion of the etching process, the wafer transfer robot 26 transfers the wafers 14 from each process chamber 28 back to the load lock/cool down chamber 22, where the wafers 14 are cooled to a temperature of typically about 17° C. Finally, the cooled wafers 14 are loaded on the wafer transfer robot or devices 20 in the wafer transfer chamber 18 and transferred to a front open unified cassette pod (FOUP) 16 at an unloading port 17, where the wafers 14 are removed from the wafer processing station 10 for subsequent transfer of the wafers 14 to another processing station or tool (not illustrated) in the clean room.

One of the problems inherent in the conventional method of cooling the wafers 14 in the low-temperature load lock/cool down chamber 22 after transfer of the wafers 14 from the high-temperature process chamber 28 is that the large disparity in temperatures between the chambers induces rapid cooling of the wafers 14, and the resulting thermal stresses tend to crack and damage the wafers 14. Such thermal stressing and damage to the wafers 14 significantly diminishes wafer throughput and adversely affects the efficiency of the entire semiconductor production process. Accordingly, a system is needed for measuring the temperature of the wafer before transfer of the wafer from the processing chamber to the load lock/cool down chamber and partially cooling the wafer before the transfer in order to prevent potentially damaging thermal stressing of the wafer.

SUMMARY OF THE INVENTION

An object of the present invention is to provide a system for measuring the temperature of an object before transfer of the object from a high-temperature environment to a low-temperature environment in order to prevent or reduce thermal stressing of the object.

Another object of the present invention is to provide a system for measuring the temperature of an object and lowering the temperature of the object as needed before transfer of the object from a high-temperature environment to a low-temperature environment in order to prevent or reduce thermal stressing of the object.

Still another object of the present invention is to provide a system which measures the temperature of an object and automatically lowers the temperature of the object prior to transferring the object to a high-temperature environment to a low-temperature environment in order to prevent or reduce thermal stressing of the object.

Yet another object of the present invention is to provide a system which utilizes a purge gas to lower the temperature of a processing chamber prior to transfer of a semiconductor wafer substrate from the processing chamber to a low-temperature cooling chamber in order to prevent or reduce thermal stressing of the wafer.

A still further object of the present invention is to provide a method of improving throughput of semiconductors in a semiconductor processing facility by preventing or substantially reducing the incidence of wafer-cracking or thermal stressing of the wafers during etching operations.

Another object of the present invention is to provide a system which utilizes thermocoupled lift pins to lower semiconductor wafers onto a heater block preparatory to an etching process in an etching chamber, raise the wafers from the heater block after the etching process, and measure the temperature of the wafers after the etching process in order to activate a wafer-cooling mechanism in the etching chamber in the event that the temperature of the wafer exceeds a predetermined temperature threshold.

In accordance with these and other objects and advantages, the present invention is a thermocoupled lift system for semiconductor etch chambers. The system comprises multiple thermocoupled lift pins which are vertically extendible from a heater block inside a semiconductor etch chamber and are capable of lowering a semiconductor wafer onto the heater block before the etching process and lifting the wafer from the heater block after the etching process. In the event that the temperature of the wafer exceeds a predetermined value after the etching process, the lift pins trigger release of a cooling purge gas such as nitrogen into the etching chamber to partially cool the wafer prior to transfer of the wafer to a cool down chamber for further cooling. The initial gas-induced cooling of the wafer prevents thermal stressing thereof upon transfer of the wafer to the cool down chamber.

BRIEF DESCRIPTION OF THE DRAWINGS

The invention will now be described, by way of example, with reference to the accompanying drawings, wherein.

DESCRIPTION OF THE PREFERRED EMBODIMENTS

Figure 1:
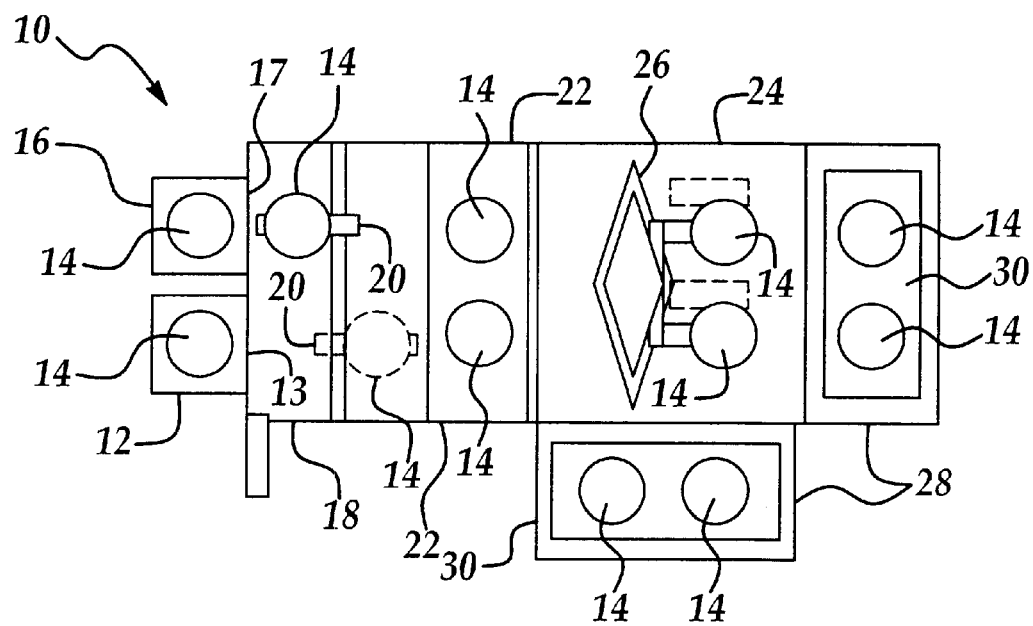
FIG. 1 is a schematic view of a typical conventional wafer processing station suitable for implementation of the present invention.
Figure 2:
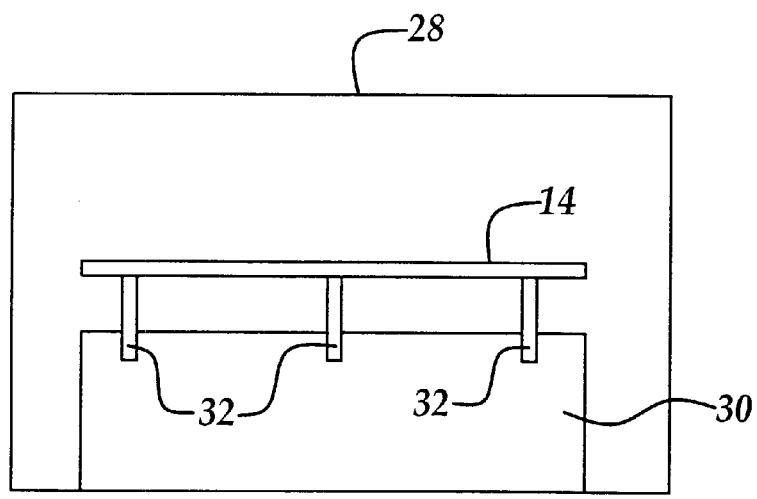
FIG. 2 is a schematic view of a process chamber in a conventional wafer processing station, with a semiconductor wafer supported by multiple lift pins disposed in a raised, extended position with respect to a heater block in the chamber.
Figure 3:
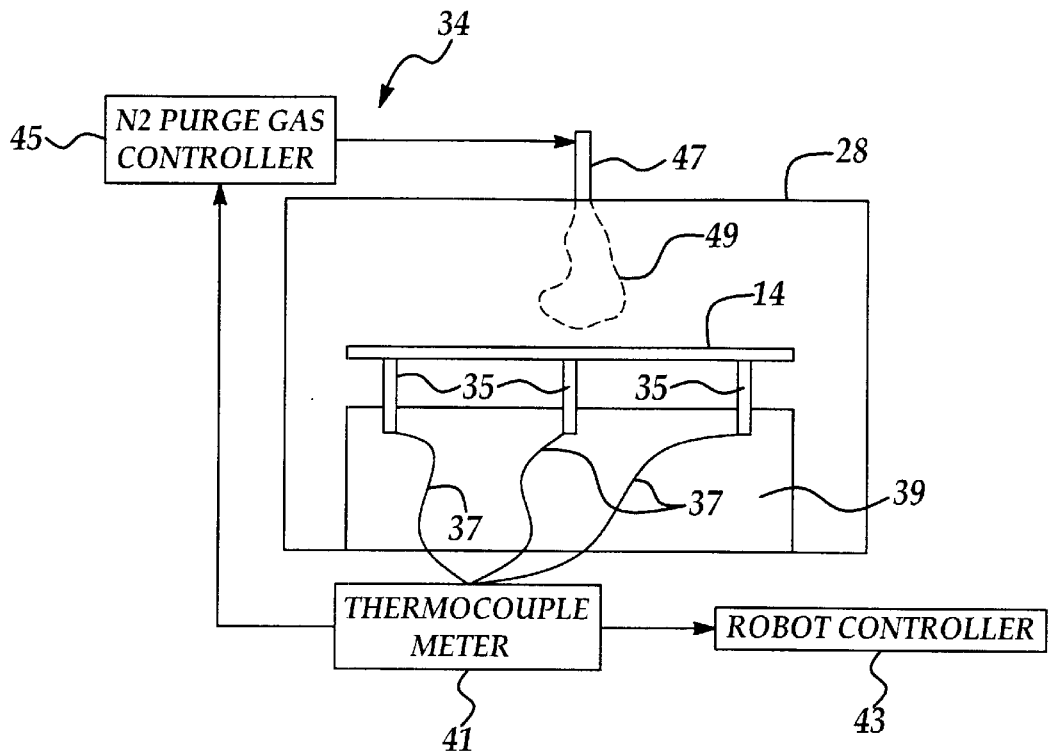
FIG. 3 is a schematic view of a process chamber in implementation of the present invention, with a semiconductor wafer supported by multiple lift pins disposed in a raised, extended position with respect to a heater block in the chamber.
Figure 4:
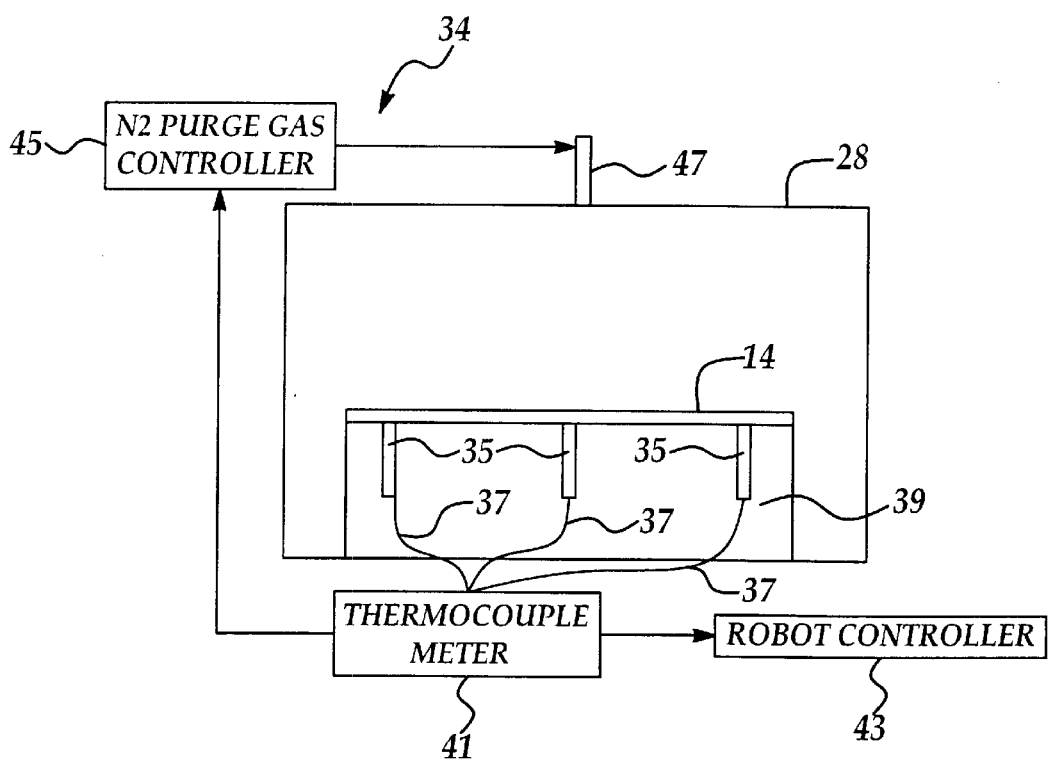
FIG. 4 is a schematic view of a process chamber in implementation of the present invention, with a semiconductor wafer supported on a heater block during an etching process in the chamber.

Referring initially to FIGS. 3 and 4 of the drawings, a thermocoupled lift pin system of the present invention is generally indicated by reference numeral 34. The thermocoupled lift pin system 34 is designed to measure the temperature of a semiconductor wafer 14 in a process chamber 28 after a high-temperature etch process is conducted on the wafer 14 in the process chamber 28. In the event that the temperature of the semiconductor wafer 14 exceeds a predetermined value after the etching process, the thermocoupled lift pin system 34 is designed to partially cool the wafer 14 prior to transfer of the wafer 14 to a cool down chamber 22 (FIG. 1). Such partial cooling of the wafer 14 prevents thermal stressing which may otherwise cause thermal cracking to the wafer 14 upon transfer of the wafer 14 from the high-temperature process chamber 28 to the significantly cooler cool down chamber 22. The thermocoupled lift pin system 34 is particularly suitable for measuring and lowering the temperature of semiconductor wafers 14 in a Mattson ASPEN-III etcher. However, it will be recognized and understood that the thermocoupled lift pin system 34 of the present invention may be equally applicable to other types of semiconductor wafer processing systems.

The thermocoupled lift pin system 34 of the present invention includes multiple thermocoupled wafer lift pins 35 which are vertically-extendible in concert with each other from respective lift pin openings (not illustrated) provided in a heater block 39 inside the process chamber 28. Typically, at least three of the wafer lift pins 35 form a triangular or other geometric pattern to facilitate supporting a semiconductor wafer 14 thereon in stable fashion when the wafer lift pins 35 are extended from the heater block 39 as illustrated in FIG. 3. Concerted upward and downward movement of the thermocoupled wafer lift pins 35 in the respective lift pin openings may be facilitated in conventional fashion by a conventional lift pin drive assembly (not illustrated), typically located inside or beneath the heater block 39. Accordingly, the thermocouple wafer lift pins 35 are capable of lifting the wafer 14 from the heater block 39, as illustrated in FIG. 3, or lowering the wafer 14 to rest on the heater block 39 for etching or other processing of the wafer 14, in conventional fashion.

The thermocoupled wafer lift pins 35 may be constructed of any suitable thermocoupling material and design known by those skilled in the art. A conventional thermocouple suitable for implementation of the present invention includes two dissimilar elements or thermoelements (not illustrated) which are joined at a bimetal junction. One of the thermoelements contacts an object or surface the temperature of which is to be measured or monitored. A voltage or electromotive force (EMF) corresponding to the temperature of the object or surface is created at the bimetal junction of the thermoelements. In the present invention, this voltage or EMF is transmitted to a thermocouple meter 41 which is connected to each thermocoupled wafer lift pin 35 by means of suitable wiring 37. The heater block 39 may be modified, as needed, to accommodate the wiring 37 to the thermocouple meter 41. The thermocouple meter 41 is capable of interpreting the voltage or EMF as the temperature of the wafer 14 after the etch process is carried out in the process chamber 28, as hereinafter further described. The above-described thermocouple design for the thermocoupled wafer lift pins 35 represents one such possible design which is suitable for implementation of the present invention. Accordingly, it will be recognized and understood that various other thermocouple designs known by those skilled in the art may be equally applicable to the invention.

As further illustrated in FIG. 3, the thermocouple meter 41 is operably connected to a robot controller 43, which automatically controls the wafer transfer robot 26 (FIG. 1) in the wafer transfer chamber 24 of the wafer processing station 10. The thermocouple meter 41 is also operably connected to a purge gas controller 45 which controls the flow of a purge gas such as nitrogen from a gas source (not illustrated) and into the process chamber 28 through a nitrogen purge gas line 47. The thermocouple meter 41 is equipped with a microprocessor and supporting software which enables the thermocouple meter 41 to compare the temperature of the wafer 14 with a predetemined temperature value programmed into the thermocouple meter and activate either the robot controller 43 or the purge gas controller 45, as appropriate depending on the temperature of the wafer 14, as hereinafter further described.

Referring again to FIGS. 1, 3 and 4 of the drawings, application of the thermocoupled lift pin system 34 will be described in conjunction with the conventional wafer processing system 10. However, it is understood that the thermocoupled lift pin system 34 of the present invention may be applicable to other types of wafer processing systems not limited to the particular design of the wafer processing station 10. Accordingly, in typical application of the thermocouple lift pin system 34 of the present invention, the wafer transfer robot 26 in the wafer transfer chamber 24 of the wafer processing station 10 initially transfers multiple semiconductor wafers 14 from the load lock/cool down chamber 22 to the process chamber or chambers 28. With the thermocouple wafer lift pins 35 extended upwardly from the heater block 39 in each processing chamber 28, the wafer transfer robot 26 positions each wafer 14 on a corresponding set of the multiple thermocouple wafer lift pins 35, as illustrated in FIG. 3. Next, the thermocouple wafer lift pins 35 are retracted downwardly into the respective lift pin openings (not illustrated) in the heater block 39 in order to lower the wafer 14 to rest on the heater block 39, as illustrated in FIG. 4. During the ensuing etching process in the process chamber 28, the heater block 39 heats the wafer 14 to temperatures typically in the range of about 200° C.–250° C. as reactive plasma or reactive gases such as chlorine are used to etch an unmasked conductive layer from each wafer 14 or etch contact vias, for example, in the wafer 14.

After completion of the etching process, the thermocouple wafer lift pins 35 are extended from the heater block 39 to lift the wafer 14 from the upper surface of the heater block 39, in conventional fashion as heretofore described. As the wafer 14 remains supported in place on the upper ends of the raised and extended thermocouple wafer lift pins 35, heat from the wafer 14 is conducted to the thermocouple wafer lift pins 35, and the conducted heat is converted to a voltage or electromotive force (EMF) value which is proportional to the conducted heat. The thermocouple meter 41 converts this voltage or EMF value into a temperature value which corresponds to the temperature of the lower or backside of the wafer 14, and compares that measured temperature value with a predetermined temperature value, typically about 100° C.–150° C., previously programmed into the microprocessor associated with the thermocouple meter 41. Depending upon whether the measured temperature exceeds or falls below the programmed temperature, the thermocouple meter 41 activates either the robot controller 43 or the purge gas controller 45, as appropriate, as follows.

In the event that the measured temperature of the wafer 14 is equal to or below the predetermined programmed wafer transfer temperature value, typically any selected temperature between about 100° C. and 150° C., and preferably, about 100° C., the thermocouple meter 41 signals the robot controller 43 to actuate the wafer transfer robot 26, which transfers the wafer 14 from the process chamber 28 to the load lock/cool down chamber 22. In the load lock/cool down chamber 22, the wafer 14 is further cooled to a temperature of typically about 17° C. Finally, the wafer transfer robot or device 20 in the wafer transfer chamber 18 transfers the wafer 14 to a front open unified cassette pod (FOUP) 16 at the unloading port 17, where multiple processed wafers 14 are placed in a wafer cassette (not illustrated) in the FOUP 16 and removed from the wafer processing station 10 for subsequent transfer of the wafers 14 to another processing station or tool (not illustrated) in the clean room.

In the event that the measured temperature of the wafer 14 exceeds the predetermined programmed wafer transfer temperature value (typically any selected temperature between about 100° C. and 150° C., and preferably about 100° C.), the thermocouple meter 41 signals the purge gas controller 45 to effect flow of purge gas 49 such as nitrogen from a gas source (not illustrated), which may be conventional, into the process chamber 28 through the nitrogen purge gas line 47, as illustrated in FIG. 3. The purge gas 49, typically maintained at room temperature in the storage mode prior to flowing into the process chamber 28, contacts the wafer 14 and gradually cools the wafer 14 as the purge gas 49 continues to flow into the process chamber 28. When the temperature of the wafer 14 drops to about 100° C. or lower, the thermocouple meter 41 first signals the purge gas controller 45 to cease flow of the purge gas 49 into the process chamber 28. Alternatively, the purge gas controller 45 may be programmed to cease flow of the purge gas 49 into the process chamber 28 after a selected volume of the purge gas 49 has entered the process chamber 28. The thermocouple meter 41 then signals the robot controller 43, which actuates the wafer transfer robot 26 to transfer the partially-cooled wafer 14 from the process chamber 28 to the load lock/cool down chamber 22. In the load lock/cool down chamber 22, the wafer 14 is further cooled to a temperature of typically about 17° C. The wafer transfer devices 20 in the wafer transfer chamber 18 then transfer the wafers 14 to the front open unified cassette pod (FOUP) 16 at the unloading port 17, where the wafers 14 are removed from the wafer processing station 10 for subsequent transfer of the wafers 14 to another processing station or tool (not illustrated) in the clean room.

In another application, the thermocouple meter 41 may be programmed to signal actuation of the purge gas controller 45 in the event that the measured temperature of the wafer 14 is greater than a programmed threshold temperature, such as 150° C., in which case purge gas 49 is introduced into the process chamber 28 and cools the wafer 14 until the wafer 14 drops below a programmed wafer transfer temperature, such as 100° C. In the event that the temperature of the wafer 14 falls between the threshold temperature (150° C.) and the wafer transfer temperature (100° C.) upon completion of the etching process in the process chamber 28, the thermocouple meter 41 signals neither the purge gas controller 45 nor the robot controller 43, but when the wafer 14 finally reaches or drops below the wafer transfer temperature by contact of the process chamber 28 with ambient air, the thermocouple meter 41 signals the robot controller 43 to transfer the wafer 14 from the process chamber 28 to the load lock/cool down chamber 22. This procedure may be used to conserve purge gas 49 when the measured temperature of the wafer 16 exceeds the wafer transfer temperature of the wafer 16 by only a small amount.

While the preferred embodiments of the invention have been described above, it will be recognized and understood that various modifications can be made in the invention and the appended claims are intended to cover all such modifications which may fall within the spirit and scope of the invention.

Having described our invention with the particularity set forth above,

We claim:

1. A thermocoupled lift pin system for a chamber including a transfer robot for moving an object to and from the chamber, said system comprising:

a robot controller operably engaging said wafer transfer robot;

a plurality of thermocoupled lift pins for mounting in the chamber; and a thermocouple meter electrically connected to said plurality of thermocoupled lift pins and operably connected to said robot controller.

2. The system of claim 1 further comprising a purge gas controller operably engaging said chamber for introducing a purge gas into said chamber and wherein said thermocouple meter operably engages said purge gas controller.

3. The system of claim 1 further comprising a heating block for mounting in the chamber and wherein said plurality of thermocoupled lift pins is extendible from said heating block.

4. The system of claim 3 further comprising a purge gas controller operably engaging said chamber for introducing a purge gas into said chamber and wherein said thermocouple meter operably engages said purge gas controller.

5. A thermocoupled lift pin system for a chamber used in the processing of a substrate, said system comprising:
   a heating block for mounting in the chamber;
   a plurality of thermocoupled lift pins vertically extendible from said heating block for lowering the substrate onto said heating block and lifting the substrate from said heating block;
   a thermocouple meter electrically connected to said plurality of thermocoupled lift pins, respectively, for measuring a temperature of the substrate;
   a robot controller operably connected to said thermocouple meter; and
   a transfer robot operably connected to said robot controller for transferring the substrate from the chamber responsive to actuation by said thermocouple meter and said robot controller when said temperature of the substrate is equal to or less than a transfer temperature.

6. The system of claim 5 further comprising a purge gas controller operably connected to said thermocouple meter for introducing a purge gas into the chamber.

7. The system of claim 5 wherein said plurality of thermocoupled lift pins comprises three thermocoupled lift pins.

8. The system of claim 7 further comprising a purge gas controller operably connected to said thermocouple meter for introducing a purge gas into the chamber.

9. A method of preventing thermal stressing of a substrate upon removal of the substrate from a high-temperature processing chamber, said method comprising the steps of:
   providing a plurality of thermocoupled lift pins in the processing chamber;
   electrically connecting a thermocouple meter to said plurality of thermocoupled lift pins, respectively;
   operably connecting a robot controller to said thermocouple meter;
   operably connecting a transfer robot to said robot controller;
   programming a substrate transfer temperature into said thermocouple meter;
   supporting the substrate on said plurality of thermocoupled lift pins;
   measuring a temperature of the substrate by operation of said thermocouple meter; and
   removing the substrate from the processing chamber by actuation of said transfer robot responsive to signaling by said thermocouple meter and operation of said robot controller, in the event that said temperature of the substrate does not exceed said substrate transfer temperature.

10. The method of claim 9 further comprising the steps of operably connecting a purge gas controller to said thermocouple meter and reducing said temperature of the substrate to said threshold temperature by introducing a purge gas into the processing chamber in the event that said temperature of the substrate exceeds said substrate transfer temperature.

11. The method of claim 9 wherein said substrate transfer temperature is in the range of about 100° C. to about 150° C.

12. The method of claim 11 further comprising the steps of operably connecting a purge gas controller to said thermocouple meter and reducing said temperature of the substrate to said substrate transfer temperature by introducing a purge gas into the processing chamber in the event that said temperature of the substrate exceeds said substrate transfer temperature.

13. The method of claim 9 further comprising the steps of providing a heating block in the processing chamber and extendibly mounting said plurality of thermocouple lift pins in said heating block.

14. The method of claim 13 further comprising the steps of operably connecting a purge gas controller to said thermocouple meter and reducing said temperature of the substrate to said substrate transfer temperature by introducing a purge gas into the processing chamber in the event that said temperature of the substrate exceeds said substrate transfer temperature.

15. The method of claim 13 wherein said substrate transfer temperature is in the range of about 100° C. to about 150° C.

16. The method of claim 15 further comprising the steps of operably connecting a purge gas controller to said thermocouple meter and reducing said temperature of the substrate to said substrate transfer temperature by introducing a purge gas into the processing chamber in the event that said temperature of the substrate exceeds said substrate transfer temperature.

17. The method of claim 9 further comprising the steps of operably connecting a purge gas controller to said thermocouple meter, programming a threshold temperature into said thermocouple meter and reducing said temperature of the substrate to said transfer temperature by introducing a purge gas into the processing chamber in the event that said temperature of the substrate exceeds said threshold temperature.

18. The method of claim 17 wherein said transfer temperature is about 100° C.

19. The method of claim 17 wherein said threshold temperature is about 150° C.

20. The method of claim 19 wherein said transfer temperature is about 100° C.

* * * * *